(12) United States Patent
Wu et al.

(10) Patent No.: US 12,396,145 B2
(45) Date of Patent: Aug. 19, 2025

(54) DISPLAY CASE AND DUAL SIDED DISPLAY

(71) Applicant: DYNASCAN TECHNOLOGY CORP., Taoyuan (TW)

(72) Inventors: Ching-Chun Wu, Taoyuan (TW); Chia-Liang Yang, Taoyuan (TW); Chin Liang Wang, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 194 days.

(21) Appl. No.: 18/242,988

(22) Filed: Sep. 6, 2023

(65) Prior Publication Data

US 2025/0081419 A1    Mar. 6, 2025

(51) Int. Cl.
*H05K 7/20* (2006.01)
*H05K 9/00* (2006.01)

(52) U.S. Cl.
CPC ..... *H05K 7/20963* (2013.01); *H05K 7/20981* (2013.01); *H05K 9/0054* (2013.01)

(58) Field of Classification Search
None
See application file for complete search history.

(56) References Cited

U.S. PATENT DOCUMENTS

| | | | |
|---|---|---|---|
| 8,351,014 B2 * | 1/2013 | Dunn | H05K 7/20972 349/161 |
| 9,622,392 B1 * | 4/2017 | Bowers | G06F 1/206 |
| 9,835,893 B2 * | 12/2017 | Dunn | F28F 3/02 |
| 10,194,564 B2 * | 1/2019 | Dunn | H05K 7/20145 |
| 10,314,212 B2 * | 6/2019 | Hubbard | G02F 1/133308 |
| 10,398,066 B2 * | 8/2019 | Dunn | G02F 1/133385 |
| 10,524,397 B2 * | 12/2019 | Dunn | H05K 7/202 |
| 10,820,445 B2 * | 10/2020 | Diaz | H05K 7/20145 |
| 11,019,735 B2 * | 5/2021 | Dunn | G09F 9/30 |

(Continued)

FOREIGN PATENT DOCUMENTS

| CN | 116634724 A | 8/2023 |
|---|---|---|
| TW | 202333121 A | 8/2023 |

OTHER PUBLICATIONS

International Search Report and Written Opinion in International Patent Application No. PCT/CN2024/101793, dated Sep. 20, 2024, in 8 pages.

*Primary Examiner* — Xanthia C Relford
*Assistant Examiner* — Xanthia C Cunningham
(74) *Attorney, Agent, or Firm* — Duane Morris LLP

(57) ABSTRACT

The present disclosure provides a display case. The display case includes a central portion having an inlet and an outlet opposite to the inlet, a first transparent lid disposed on a first side of the central portion, a second transparent lid disposed on a second side of the central portion, and a heat exchanger in the central portion. The first transparent lid is configured to define a first space on the first side of the central portion and the second transparent lid is configured to define a second space on the second side of the central portion. The heat exchanger includes a first channel and a second channel. The first channel of the heat exchanger is fluidly conducted to the first space and defines a part of a first internal heat exchange loop. The second channel of the heat exchanger is fluidly conducted to the second space and defines a part of a second internal heat exchange loop. The present disclosure also provides a dual sided display.

30 Claims, 13 Drawing Sheets

(56) References Cited

U.S. PATENT DOCUMENTS

| | | | |
|---|---|---|---|
| 11,690,205 B1 | 6/2023 | Wang | |
| 11,744,054 B2 * | 8/2023 | Dunn | H05K 7/202 |
| | | | 361/695 |
| 2011/0058326 A1 * | 3/2011 | Idems | G09F 9/30 |
| | | | 361/679.21 |
| 2012/0026432 A1 | 2/2012 | Dunn et al. | |
| 2017/0083062 A1 * | 3/2017 | Bowers | G06F 1/206 |
| 2023/0164964 A1 * | 5/2023 | Dunn | H05K 7/20981 |
| | | | 361/688 |

* cited by examiner

DISPLAY CASE AND DUAL SIDED DISPLAY

BACKGROUND

1. Technical Field

The present disclosure generally relates to a display case and a dual sided display.

2. Description of the Related Art

A cooling system may be used in a display apparatus to prevent overheating. A cooling system may include an external heat dissipation path in thermal conduction with an external heat dissipation path, facilitating the dissipation of heat to the outside. Conventionally, the external heat dissipation path may extend to both sides of the cooling system, making the cooling system susceptible to water leakage. In addition, increasing environmental awareness calls for a universal display case that can accommodate various displays.

SUMMARY

In one or more embodiments, the present disclosure provides a display case. The display case includes a central portion having an inlet and an outlet opposite to the inlet, a first transparent lid disposed on a first side of the central portion, a second transparent lid disposed on a second side of the central portion, and a heat exchanger in the central portion. The first transparent lid is configured to define a first space on the first side of the central portion and the second transparent lid is configured to define a second space on the second side of the central portion. The heat exchanger includes a first channel and a second channel. The first channel of the heat exchanger is fluidly conducted to the first space and defines a part of a first internal heat exchange loop. The second channel of the heat exchanger is fluidly conducted to the second space and defines a part of a second internal heat exchange loop.

In one or more embodiments, the present disclosure provides a display case. The display case includes a central portion having an inlet and an outlet opposite to the inlet, a first transparent lid disposed on a first side of the central portion, a second transparent lid disposed on a second side of the central portion, and a heat exchanger in the central portion. The first transparent lid is configured to define a first space on the first side of the central portion and the second transparent lid is configured to define a second space on the second side of the central portion. The heat exchanger includes a first channel fluidly conducted to the first space, a second channel fluidly conducted to the second space, a third channel, and a fourth channel. The third channel and the fourth channel define an external heat dissipation path connected between the inlet and the outlet of the central portion, and the external heat dissipation path is isolated from the first space and the second space.

In one or more embodiments, the present disclosure a dual sided display. The dual sided display includes a central portion having an inlet and an outlet opposite to the inlet, a first display module disposed in a first space on a first side of the central portion, a second display module disposed in a second space on a second side of the central portion, and a heat exchanger in the central portion. The heat exchanger includes a first channel fluidly conducted to the first space, a second channel fluidly conducted to the second space, a third channel, and a fourth channel. The third channel and the fourth channel define an external heat dissipation path connected between the inlet and the outlet of the central portion, and the external heat dissipation path is isolated from the first space and the second space.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
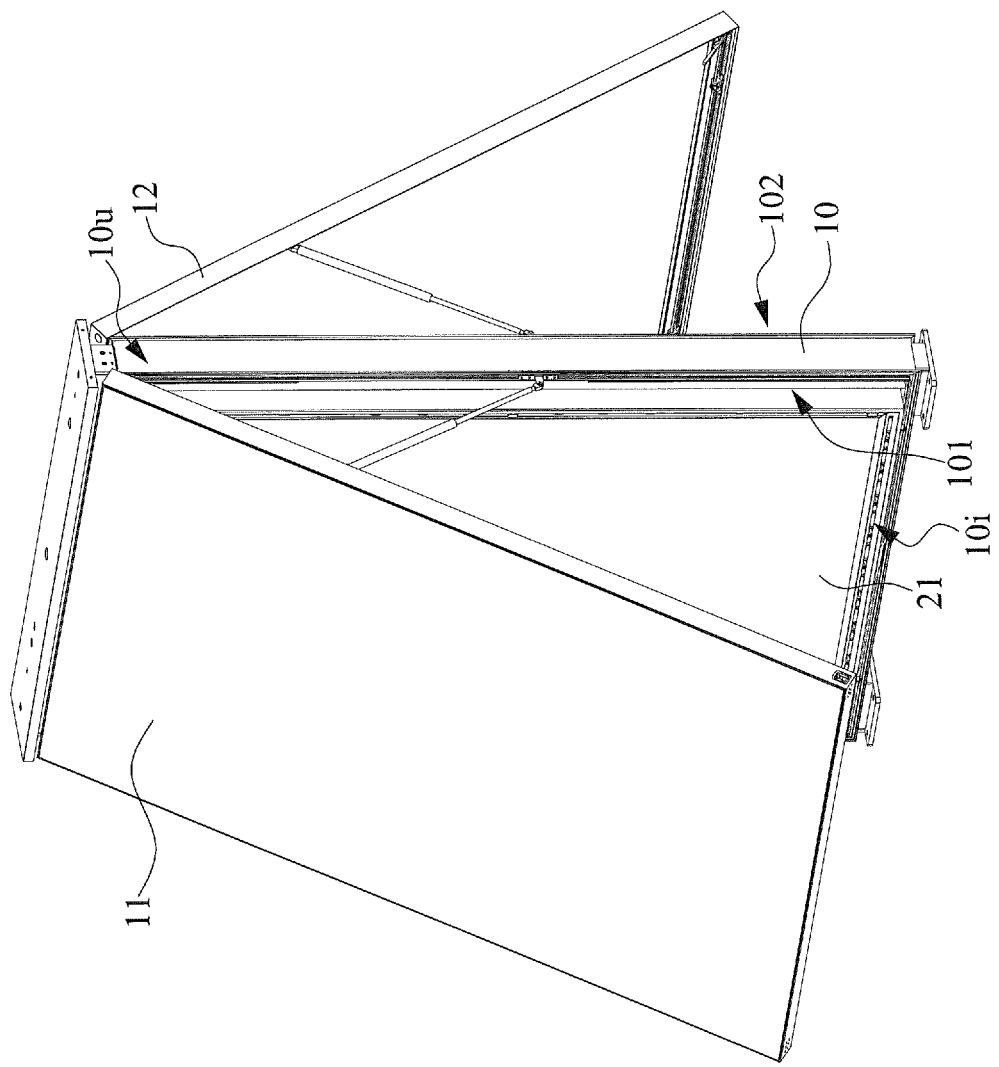
FIG. 1 is a perspective view of a display case, in accordance with an embodiment of the present disclosure.

The following disclosure provides many different embodiments, or examples, for implementing different features of the provided subject matter. Specific examples of components and arrangements are described herein. These are, of course, merely examples and are not intended to be limiting. The present disclosure may repeat reference numerals and/or letters in the various examples. This repetition is for simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

Figure 2:
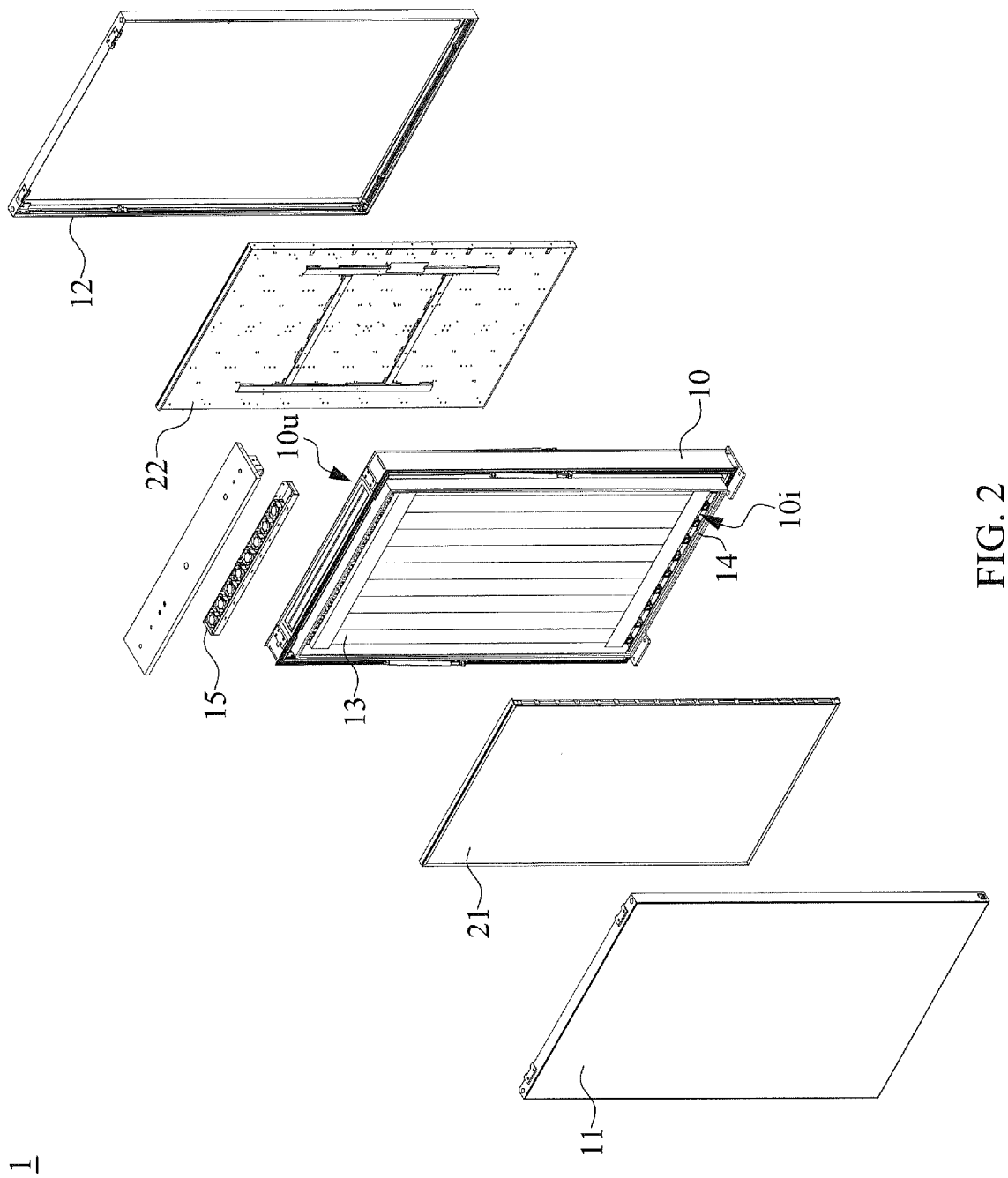
FIG. 2 is an explosive view of a display case, in accordance with an embodiment of the present disclosure.

FIG. 1 is a perspective view of a display case 1, in accordance with an embodiment of the present disclosure. FIG. 2 is an explosive view of the display case 1, in accordance with an embodiment of the present disclosure.

In some embodiments, the display case 1 may include a central portion 10, transparent lids 11, 12, a heat exchanger 13 (labelled in FIG. 2), an internal flow generator 14 (labelled in FIG. 2), and an external flow generator 15 (labelled in FIG. 2).

The central portion 10 may have an inlet 10$i$ and an outlet 10$u$ opposite to the inlet 10$i$. The central portion 10 may have a side 101 and a side 102 opposite to the side 101. The central portion 10 may be configured to accommodate the heat exchanger 13. The internal flow generator 14 and the external flow generator 15 may be disposed adjacent to the central portion 10 and the heat exchanger 13.

The transparent lid 11 may be disposed on the side 101 of the central portion 10. The transparent lid 11 may be rotatably connected to the central portion 10 through one or more pivot joints (such as the pivot joint 11$p$ in FIG. 3). The transparent lid 11 may be closed (such as at a first location) or opened (such as at a second location) with respect to the central portion 10 through one or more pivot joints.

Figure 3:
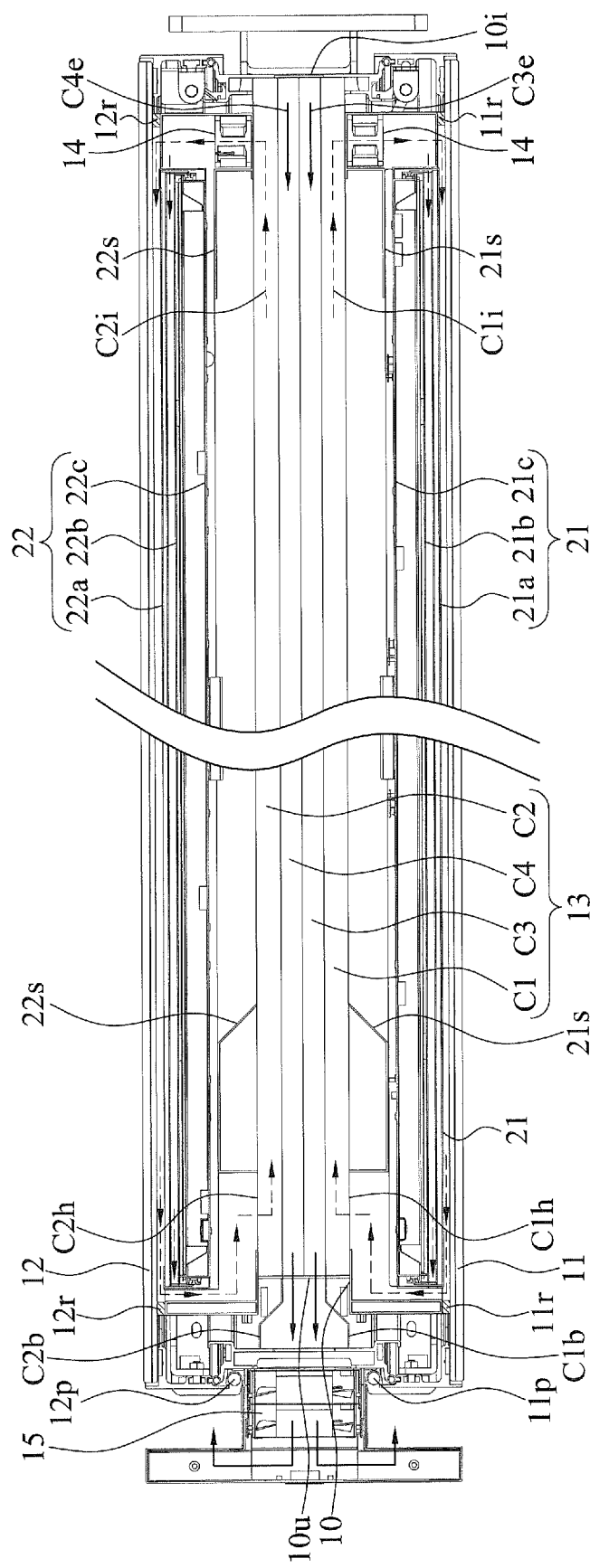
FIG. 3 is a cross-section of a display case, in accordance with an embodiment of the present disclosure.

The transparent lid 11 may be removably attached to the central portion 10 through one or more sealing components (such as the sealing component 11$r$ in FIG. 3). In some embodiments, the sealing component may include rubber gaskets or O-rings. In some embodiments, the sealing component may be disposed between the transparent lid 11 and the central portion 10. In some embodiments, the sealing component may be arranged at a periphery of the transparent lid 11.

The transparent lid 11 and the central portion 10 may define a space on the side 101. A display module 21 may be disposed in the space on the side 101. In some embodiments, as shown in FIG. 1, when the transparent lid 11 is opened (such as at a second location), the display module 21 may be exposed to the external environment (such as air) or to the outside of the display case 1.

In some embodiments, as shown in FIG. 3, when the transparent lid 11 is closed (such as at a first location), the transparent lid 11 may be attached to the central portion 10 through the sealing component 11$r$. The transparent lid 11 and the sealing component 11$r$ may isolate the space on the side 101 from the external environment (such as air). For example, the transparent lid 11, the central portion 10, and the sealing component 11$r$ may define an airtight space for the display module 21.

The transparent lid 12 may be disposed on the side 102 of the central portion 10. The transparent lid 12 may be rotatably connected to the central portion 10 through one or more pivot joints (such as the pivot joint 12$p$ in FIG. 3). The transparent lid 12 may be closed (such as at a first location) or opened (such as at a second location) with respect to the central portion 10 through one or more pivot joints.

The transparent lid 12 may be removably attached to the central portion 10 through one or more sealing components (such as the sealing component 12$r$ in FIG. 3). In some embodiments, the sealing component may include rubber gaskets or O-rings. In some embodiments, the sealing component may be disposed between the transparent lid 12 and the central portion 10. In some embodiments, the sealing component may be arranged at a periphery of the transparent lid 12.

The transparent lid 12 and the central portion 10 may define a space on the side 102. A display module 22 (labelled in FIG. 2) may be disposed in the space on the side 102. In some embodiments, as shown in FIG. 1, when the transparent lid 12 is opened (such as at a second location), the display module 22 (labelled in FIG. 2) may be exposed to the external environment (such as air) or to the outside of the display case 1. In some embodiments, the display module 22 is detachable. Once the display module 22 disposed in display case is malfunctioned or broken, the display case can be re-used.

In some embodiments, as shown in FIG. 3, when the transparent lid 12 is closed (such as at a first location), the transparent lid 12 may be attached to the central portion 10 through the sealing component 12$r$. The transparent lid 12 and the sealing component 12$r$ may isolate the space on the side 102 from the external environment (such as air). For example, the transparent lid 12, the central portion 10, and the sealing component 12$r$ may define an airtight space for the display module 22.

The display case 1, the display module 21, and the display module 22 may be collectively referred to as a dual sided display.

Although the display case 1 used in combination with the display module 21 and the display module 22 is illustrated, the present invention is not limited thereto. The display case 1 can be a universal display case used in combination with other devices, other displays, or other panels.

The heat exchanger 13 may be disposed in the central portion 10. In some embodiments, the heat exchanger 13 may be integrated in the central portion 10. In some embodiments, the heat exchanger 13 may be defined by the central portion 10. In some embodiments, the heat exchanger 13 may be a part of the central portion 10. The heat exchanger 13 may include channels for internal heat exchange loops and channels for external heat dissipation paths (further described with respect to FIG. 3).

The internal flow generator 14 may be disposed adjacent to the inlet 10$i$ of the central portion 10. In some embodiments, the internal flow generator 14 may include a fan. In some embodiments, the internal flow generator 14 may be configured to generate an internal airflow through the internal heat exchange loops.

The external flow generator 15 may be disposed adjacent to the outlet 10$u$ of the central portion 10. In some embodiments, the external flow generator 15 may include a fan. In some embodiments, the external flow generator 15 may be configured to generate an external or ambient airflow through the external heat dissipation paths.

FIG. 3 is a cross-section of the display case 1, in accordance with an embodiment of the present disclosure.

In some embodiments, the heat exchanger 13 may include an aluminum extrusion (such as an aluminum t-slot extrusion). In some embodiments, the heat exchanger 13 may include a plurality of channels or cells. For example, the central portion 10 may include or define a channel C1, a channel C2, a channel C3, and a channel C4. In some embodiments, the channel C1, the channel C3, the channel C4, and the channel C2 may be sequentially stacked on top of each other. In some embodiments, the heat exchanger 13 may be integrally formed or formed as one piece.

The channel C1 of the heat exchanger 13 may be fluidly conducted to the space defined by the transparent lid 11, the central portion 10, and the sealing component 11$r$ for accommodating the display module 21. The channel C1 may be adjacent to and thermally connected to the display module 21. The channel C1 may define a part of an internal heat exchange loop C1$i$.

The channel C2 of the heat exchanger 13 may be fluidly conducted to the space defined by the transparent lid 12, the central portion 10, and the sealing component 12$r$ for accommodating the display module 22. The channel C2 may be adjacent to and thermally connected to the display module 22. The channel C2 may define a part of an internal heat exchange loop C2i.

Figure 6:
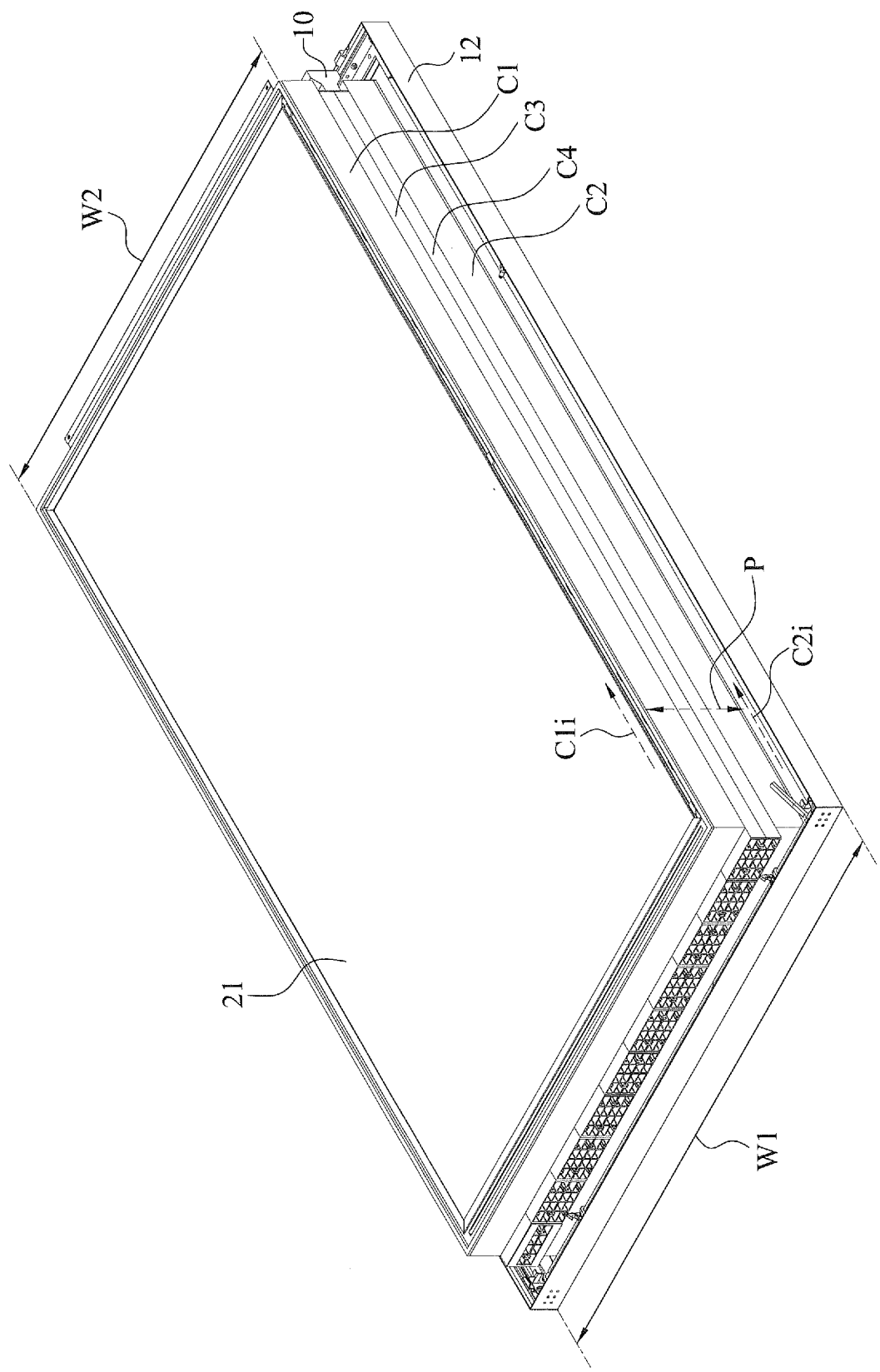
FIG. 6 is a perspective view of a part of a display case, in accordance with an embodiment of the present disclosure.

The internal heat exchange loop C2i may be fluidly conducted to the internal heat exchange loop C1i (further described with respect to FIG. 6). Therefore, the space defined by the transparent lid 11, the central portion 10, and the sealing component 11r for accommodating the display module 21 may be fluidly conducted to the space defined by the transparent lid 12, the central portion 10, and the sealing component 12r for accommodating the display module 22.

The channels C3 and C4 of the heat exchanger 13 may be fluidly conducted to the external environment through the inlet 10i and the outlet 10u. For example, external airflows may enter the channels C3 and C4 through the inlet 10i and exit the channels C3 and C4 through the outlet 10u. The channel C3 may define an external heat dissipation path C3e. The channel C4 may define an external heat dissipation path C4e. The external flow generator 15 may be disposed adjacent to the channels C3 and C4 and configured to generate external airflows through the external heat dissipation paths C3e and C4e.

The channel C3 may be adjacent to and thermally connected to the channel C1. In some embodiments, the external heat dissipation path C3e defined by the channel C3 may be configured to dissipate heat from the internal heat exchange loop C1i defined by the channel C1. In some embodiments, the flow direction of the channel C1 may be opposite to the flow direction of the channel C3.

The channel C4 may be adjacent to and thermally connected to the channel C2. In some embodiments, the external heat dissipation path C4e defined by the channel C4 may be configured to dissipate heat from the internal heat exchange loop C2i defined by the channel C2. In some embodiments, the flow direction of the channel C2 may be opposite to the flow direction of the channel C4.

In some embodiments, the display module 21 may be supported or carried on the heat exchanger 13 through one or more carriers (or supporting elements) 21s. For example, the carrier 21s may provide mechanical support for the display module 21. For example, the carrier 21s may directly contact the display module 21 (such as a backlight layer 21c of the display module 21) and directly contact the heat exchanger 13. For example, the display module 21 may have a front side configured to emit a light and a rear side directly contacting the carrier 21s.

In some embodiments, the display module 21 may include a display panel 21a, an optical film 21b, and the backlight layer 21c. The display panel 21a may be disposed between the optical film 21b and the transparent lid 11. The optical film 21b may be disposed between the display panel 21a and the backlight layer 21c. The backlight layer 21c may be disposed between the optical film 21b and the carrier 21s.

The display panel 21a may include, for example, a glass panel, a liquid crystal panel, a plastic panel, or other types of panels. The optical film 21b may include, for example, a diffuser, a reflector, a polarizer, a filter, a light guiding element, a lens, or other optical elements. The backlight layer 21c may include a plurality of light emitting pixels.

In some embodiments, the internal flow generator 14 may be disposed adjacent to the carrier 21s. In some embodiments, the internal flow generator 14 may be disposed adjacent to the channel C1 of the heat exchanger 13. In some embodiments, the internal flow generator 14 may be configured to generate an internal airflow through the internal heat exchange loop C1i. For example, the internal flow generator 14 may be fluidly conducted to the channel C1.

The internal flow generator 14 may be configured to exhaust air from the channel C1 into the space defined by the transparent lid 11, the central portion 10, and the sealing component 11r for accommodating the display module 21.

In some embodiments, the internal airflow generated by the internal flow generator 14 may flow between the transparent lid 11 and the display panel 21a, and flow between the display panel 21a and the optical film 21b. Then, the internal airflow may flow into the channel C1 through an opening (or a hole) C1h on the sidewall of the channel C1.

In some embodiments, the internal heat exchange loop C1i may be isolated from the external environment. For example, the external airflow may not enter the internal heat exchange loop C1i. For example, the internal heat exchange loop C1i may be isolated from the external heat dissipation path C3e by a baffle C1b. The baffle C1b may be a part of the heat exchanger 13 or may be connected to the heat exchanger 13. The baffle C1b may extend from the sidewall of the channel C1.

In some embodiments, the display module 22 may be supported or carried on the heat exchanger 13 through one or more carriers (or supporting elements) 22s. For example, the carrier 22s may provide mechanical support for the display module 22. For example, the carrier 22s may directly contact the display module 22 (such as a backlight layer 22c of the display module 22) and directly contact the heat exchanger 13. For example, the display module 22 may have a front side configured to emit a light and a rear side directly contacting the carrier 22s.

In some embodiments, similar to the display module 21, the display module 22 may include a display panel 22a, an optical film 22b, and the backlight layer 22c.

In some embodiments, the internal flow generator 14 may be disposed adjacent to the carrier 22s. In some embodiments, the internal flow generator 14 may be disposed adjacent to the channel C2 of the heat exchanger 13. In some embodiments, the internal flow generator 14 may be configured to generate an internal airflow through the internal heat exchange loop C2i. For example, the internal flow generator 14 may be fluidly conducted to the channel C2. The internal flow generator 14 may be configured to exhaust air from the channel C2 into the space defined by the transparent lid 12, the central portion 10, and the sealing component 12r for accommodating the display module 22.

In some embodiments, the internal airflow generated by the internal flow generator 14 may flow between the transparent lid 12 and the display panel 22a, and flow between the display panel 22a and the optical film 22b. Then, the internal airflow may flow into the channel C2 through an opening (or a hole) C2h on the sidewall of the channel C2.

In some embodiments, the internal heat exchange loop C2i may be isolated from the external environment. For example, the external airflow may not enter the internal heat exchange loop C2i. For example, the internal heat exchange loop C2i may be isolated from the external heat dissipation path C4e by a baffle C2b. The baffle C2b may be a part of the heat exchanger 13 or may be connected to the heat exchanger 13. The baffle C2b may extend from the sidewall of the channel C2.

Figure 4:
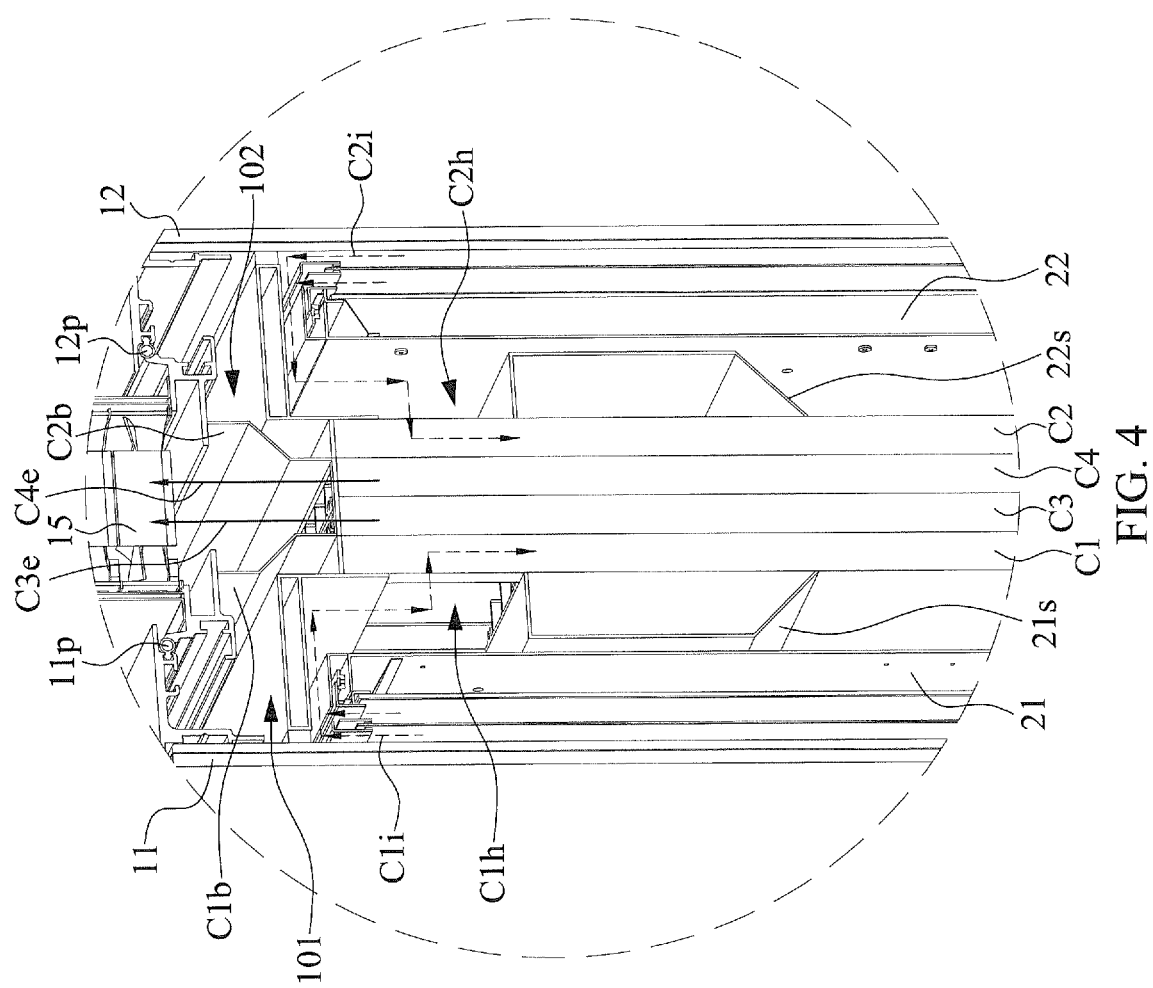
FIG. 4 is a cross-section of a part of a display case, in accordance with an embodiment of the present disclosure.

FIG. 4 is a cross-section of a part of the display case 1 in FIG. 3, in accordance with an embodiment of the present disclosure.

The external heat dissipation path C3e defined by the channel C3 may be isolated from the space on the side 101 (and from the channel C1) by the baffle C1b. The baffle C1b may extend from a sidewall of the channel C3 (or a sidewall of the channel C1) to a part of the transparent lid 11.

With or without the transparent lid 11 is closed, the external heat dissipation path C3e defined by the channel C3 may be isolated from the space on the side 101 by the baffle C1b.

The internal airflow of the internal heat exchange loop C1i may flow into the channel C1 through the opening C1h on the sidewall of the channel C1.

The external heat dissipation path C4e defined by the channel C4 may be isolated from the space on the side 102 (and from the channel C2) by the baffle C2b. The baffle C2b may extend from a sidewall of the channel C4 (or a sidewall of the channel C2) to a part of the transparent lid 12.

With or without the transparent lid 12 is closed, the external heat dissipation path C4e defined by the channel C4 may be isolated from the space on the side 102 by the baffle C2b.

The internal airflow of the internal heat exchange loop C2i may flow into the channel C2 through the opening C2h on the sidewall of the channel C2.

Figure 5:
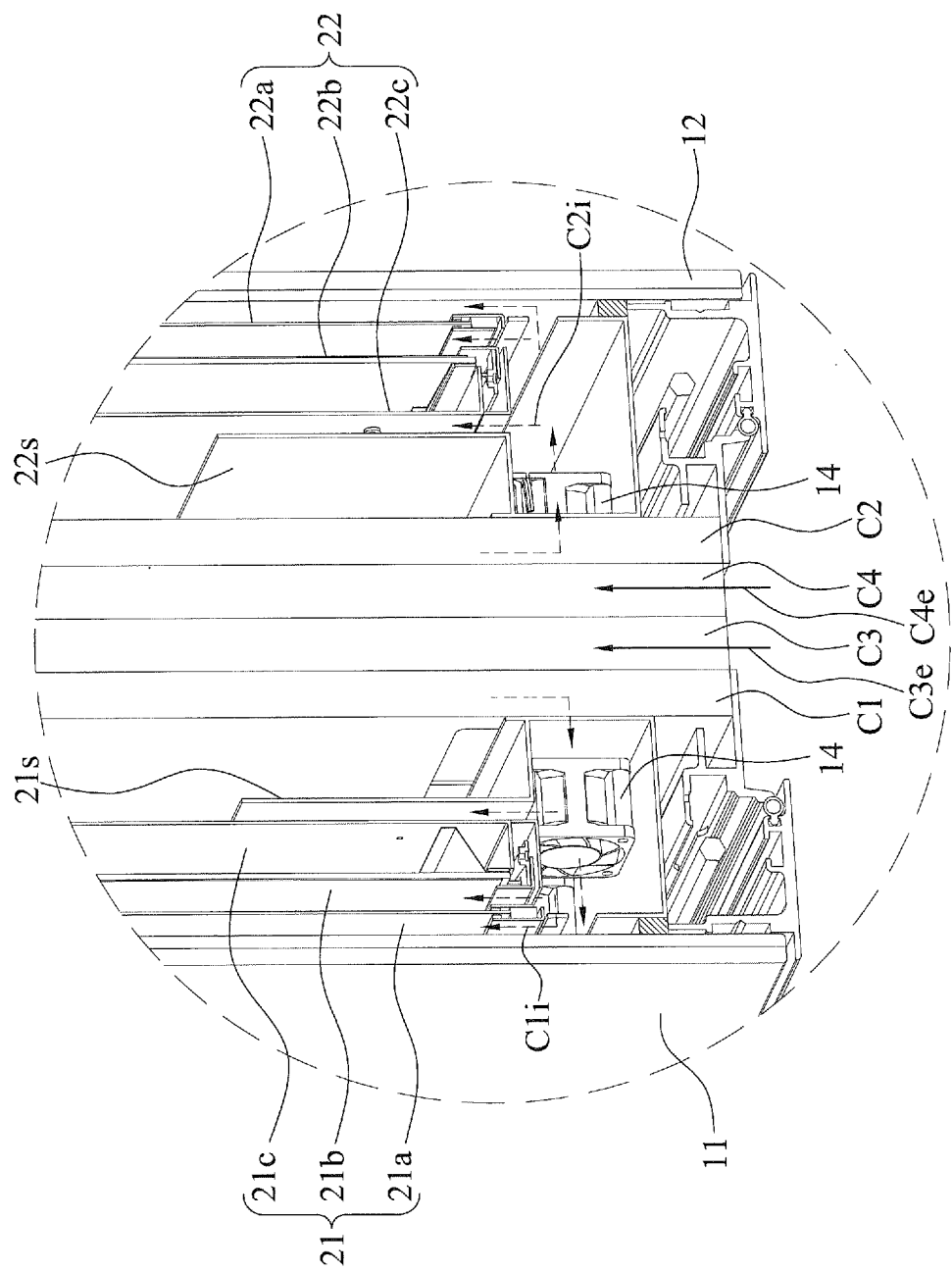
FIG. 5 is a cross-section of a part of a display case, in accordance with an embodiment of the present disclosure.

FIG. 5 is a cross-section of a part of the display case 1 in FIG. 3, in accordance with an embodiment of the present disclosure.

The internal flow generator 14 (on the leftside) may be disposed adjacent to the channel C1 and may be fluidly conducted to the channel C1. The internal flow generator 14 may be configured to exhaust air from the channel C1 and generate an internal airflow of the internal heat exchange loop C1i, which flows between the transparent lid 11 and the display panel 21a and flows between the display panel 21a and the optical film 21b.

The internal flow generator 14 (on the rightside) may be disposed adjacent to the channel C2 and may be fluidly conducted to the channel C2. The internal flow generator 14 may be configured to exhaust air from the channel C2 and generate an internal airflow of the internal heat exchange loop C2i, which flows between the transparent lid 12 and the display panel 22a and flows between the display panel 22a and the optical film 22b.

FIG. 6 is a perspective view of a part of the display case 1, in accordance with an embodiment of the present disclosure. For conciseness and clearness, the transparent lid 11, the internal flow generator 14, the external flow generator 15, and the display module 22 are not shown in FIG. 6.

The width w1 of the transparent lid 12 (and the transparent lid 11) of the display case 1 may be greater than the width w2 of the display module 21 (and the display module 22). When the transparent lids 11 and 12 are closed, the transparent lids 11 and 12 may define an airtight space for the display modules 21 and 22. The internal heat exchange loop C1i may be fluidly conducted to the internal heat exchange loop C2i on at least a side of the display case 1. For example, the internal heat exchange loop C1i and the internal heat exchange loop C2i may be fluidly conducted through a path P crossing the channels C1, C2, C3 and C4.

According to some embodiments of the present disclosure, the size of the display case 1 is reduced because the channels C1, C2, C3 and C4 of the heat exchanger 13 are integrated in the central portion 10. In addition, by isolating the external heat dissipation path C3e and the external heat dissipation path C4e from the internal heat exchange loop C1i and the internal heat exchange loop C2i, the water resistance of the display case 1 is improved. Furthermore, since the internal heat exchange loop C1i and the internal heat exchange loop C2i are fluidly conducted, the temperature on the sides 101 and 102 of the central portion 10 can be balanced. The heat dissipation efficiency can be improved.

FIGS. 7A, 7B, 7C, 7D, 7E, 7F, and 7G are cross-sections of a part of a display case, in accordance with an embodiment of the present disclosure. In some embodiments, the heat exchanger 13 of the display case 1 may have variations as shown in FIGS. 7A, 7B, 7C, 7D, 7E, 7F, and 7G.

Figure 7A:
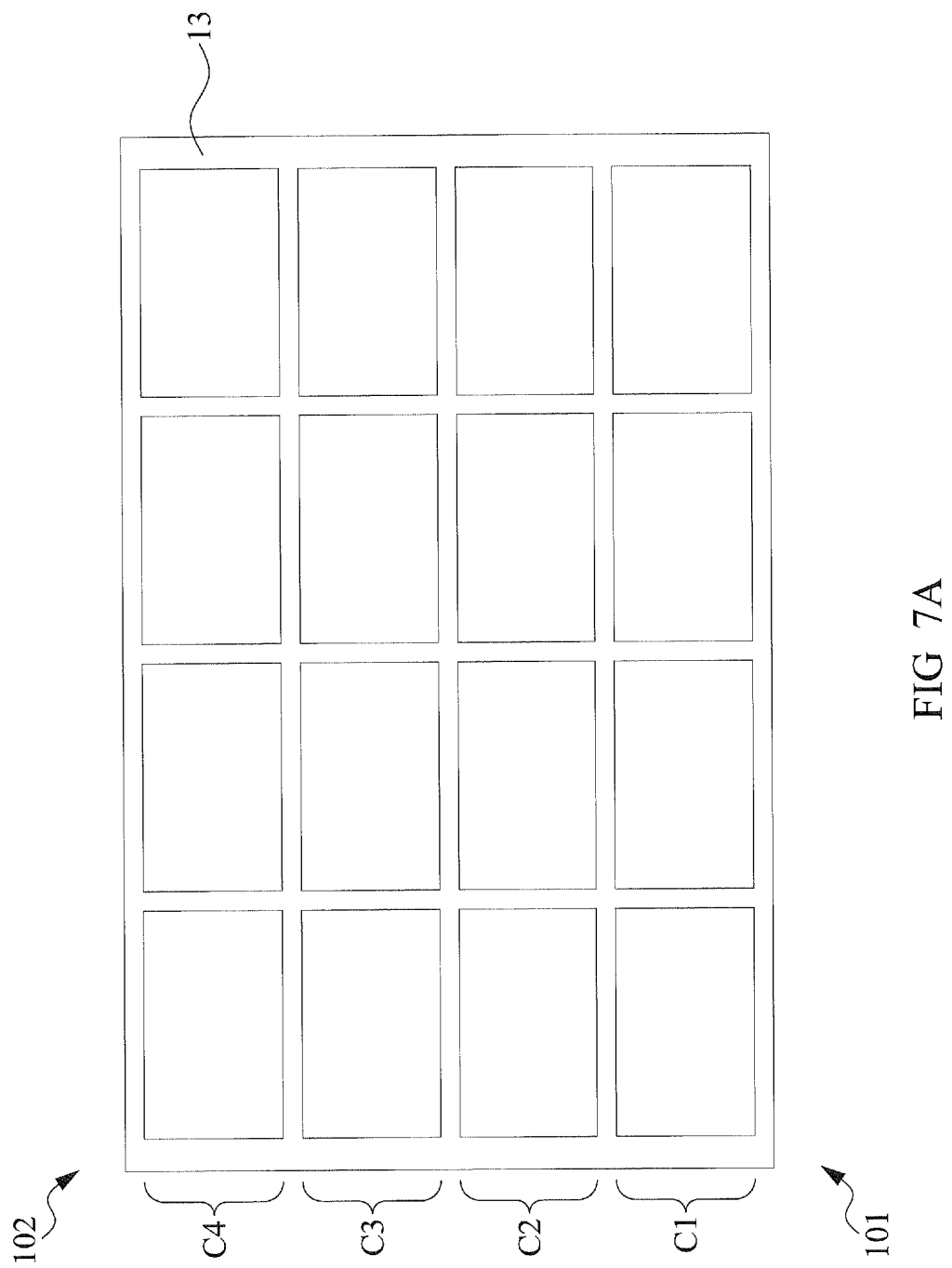
FIG. 7A is a cross-section of a part of a display case, in accordance with an embodiment of the present disclosure.

Referring to FIG. 7A, the heat exchanger 13 may have four sets, and each set has the channel C1, the channel C3, the channel C4, and the channel C2 sequentially stacked on top of the other. In some embodiments, the heat exchanger 13 may include, but are not limited to, one set, two sets, three sets, four sets, or more.

Figure 7B:
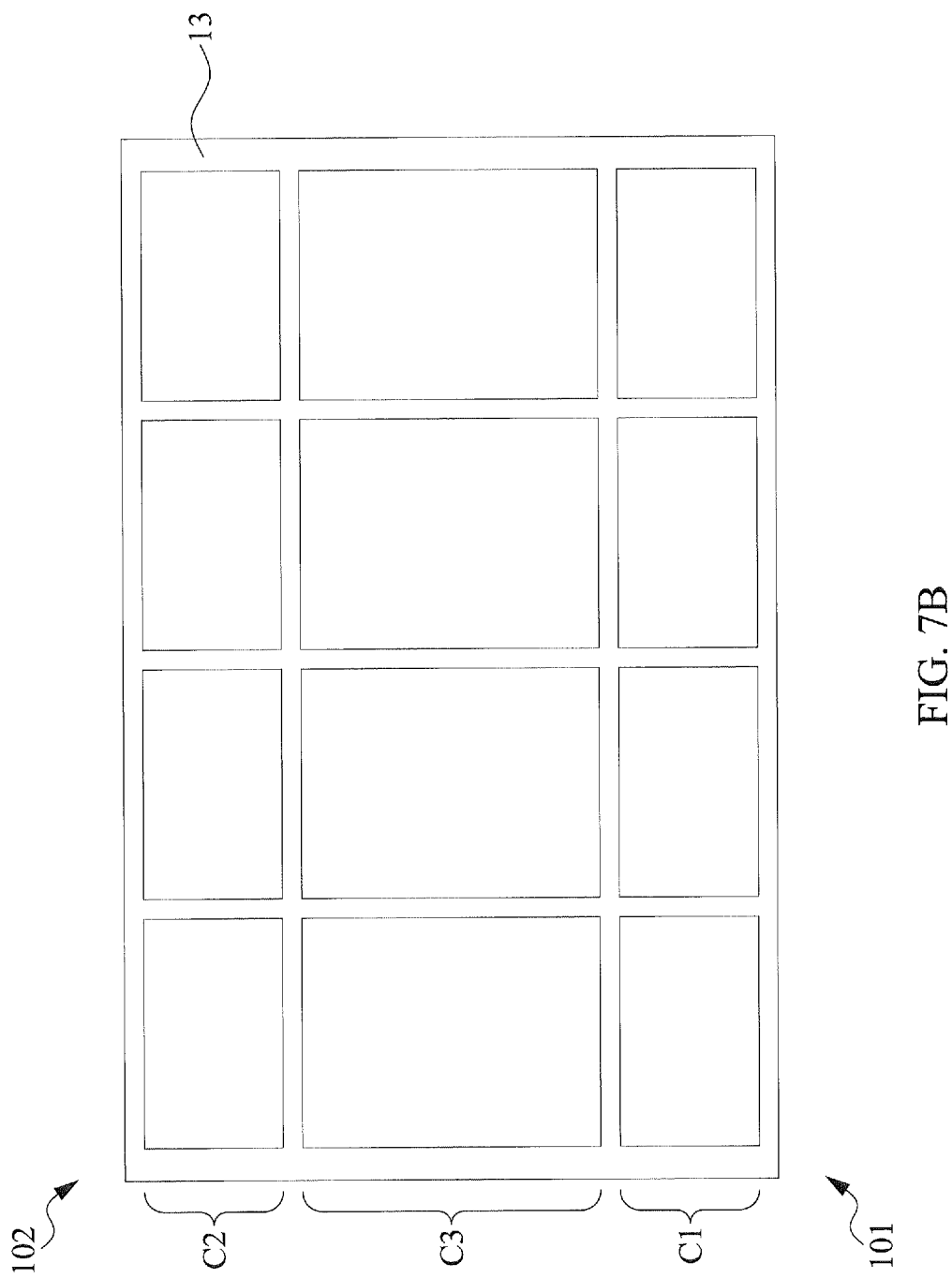
FIG. 7B is a cross-section of a part of a display case, in accordance with an embodiment of the present disclosure.

Referring to FIG. 7B, the heat exchanger 13 in FIG. 7B is similar to the heat exchanger 13 in FIG. 7A, with differences in that the heat exchanger 13 in FIG. 7B is exclusive of the channel C4. For example, in one set of the heat exchanger 13 in FIG. 7B, the channel C1, the channel C3, and the channel C2 are sequentially stacked on top of the other. The channel C3 defines an external heat dissipation path that is shared by the channel C1 and the channel C2.

Figure 7C:
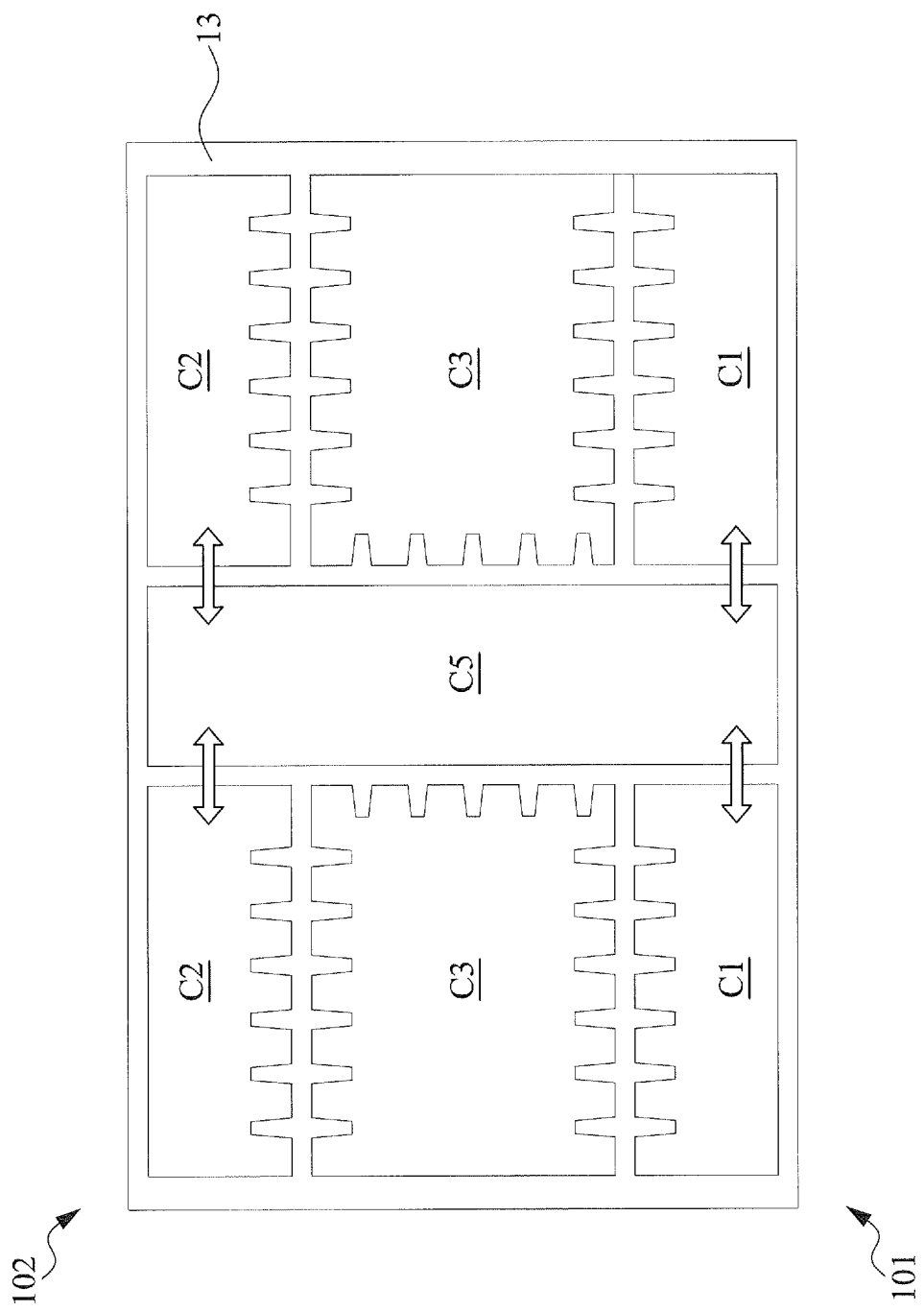
FIG. 7C is a cross-section of a part of a display case, in accordance with an embodiment of the present disclosure.

Referring to FIG. 7C, the heat exchanger 13 in FIG. 7C is similar to the heat exchanger 13 in FIG. 7B, with differences in that the heat exchanger 13 in FIG. 7C has an interconnecting channel C5 extending between the sides 101 and 102. The interconnecting channel C5 may cross the channel C1, the channel C3, and the channel C2. The channel C1 and the channel C2 may be fluidly conducted (or thermally conducted) through the interconnecting channel C5, as indicated by the arrows. For example, one or more openings may be formed between the channel C1 and the interconnecting channel C5, and one or more openings may be formed between the channel C2 and the interconnecting channel C5. The channel C1 and the channel C2 may be fluidly conducted through the interconnecting channel C5 by heat convection. Alternatively, the channel C1 and the channel C2 may be thermally conducted through the interconnecting channel C5 by heat conduction. Therefore, in addition to fluidly conducting on at least one side of the display case (as shown in FIG. 6), the display case may further have fluidly conducting (or thermally conducting) on the central portion thereof to facilitate temperature balancing.

Figure 7D:
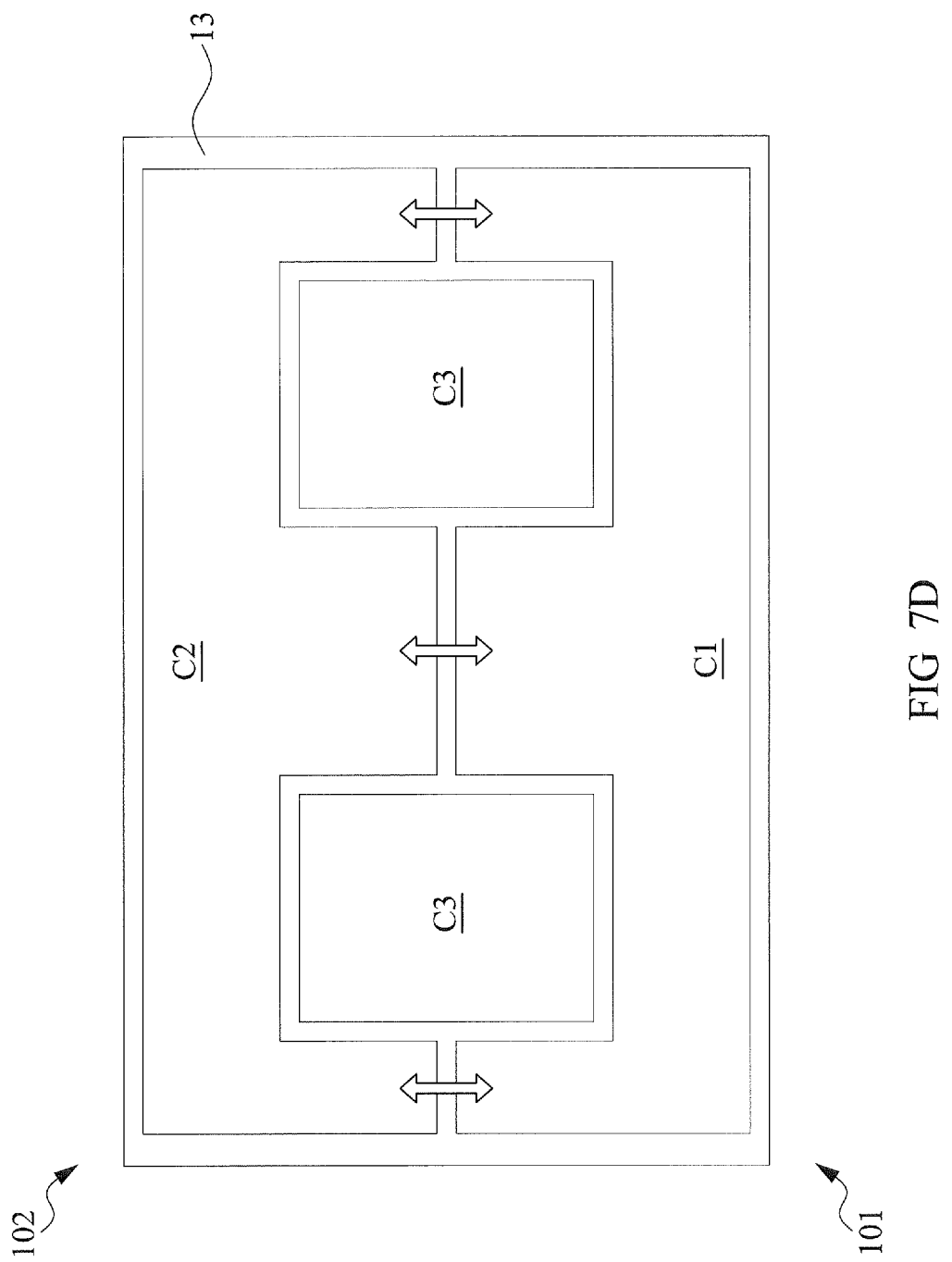
FIG. 7D is a cross-section of a part of a display case, in accordance with an embodiment of the present disclosure.

Referring to FIG. 7D, the heat exchanger 13 in FIG. 7D is similar to the heat exchanger 13 in FIG. 7C, with differences in that channel C3 may be surrounded by the channel C1 and the channel C2 and that the channel C1 and the channel C2 may be fluidly conducted (or thermally conducted) without the interconnecting channel C5, as indicated by the arrows. For example, one or more openings may be formed between the channel C1 and the channel C2. The channel C1 and the channel C2 may be fluidly conducted by heat convection. Alternatively, the channel C1 and the channel C2 may be thermally conducted by heat conduction.

Figure 7E:
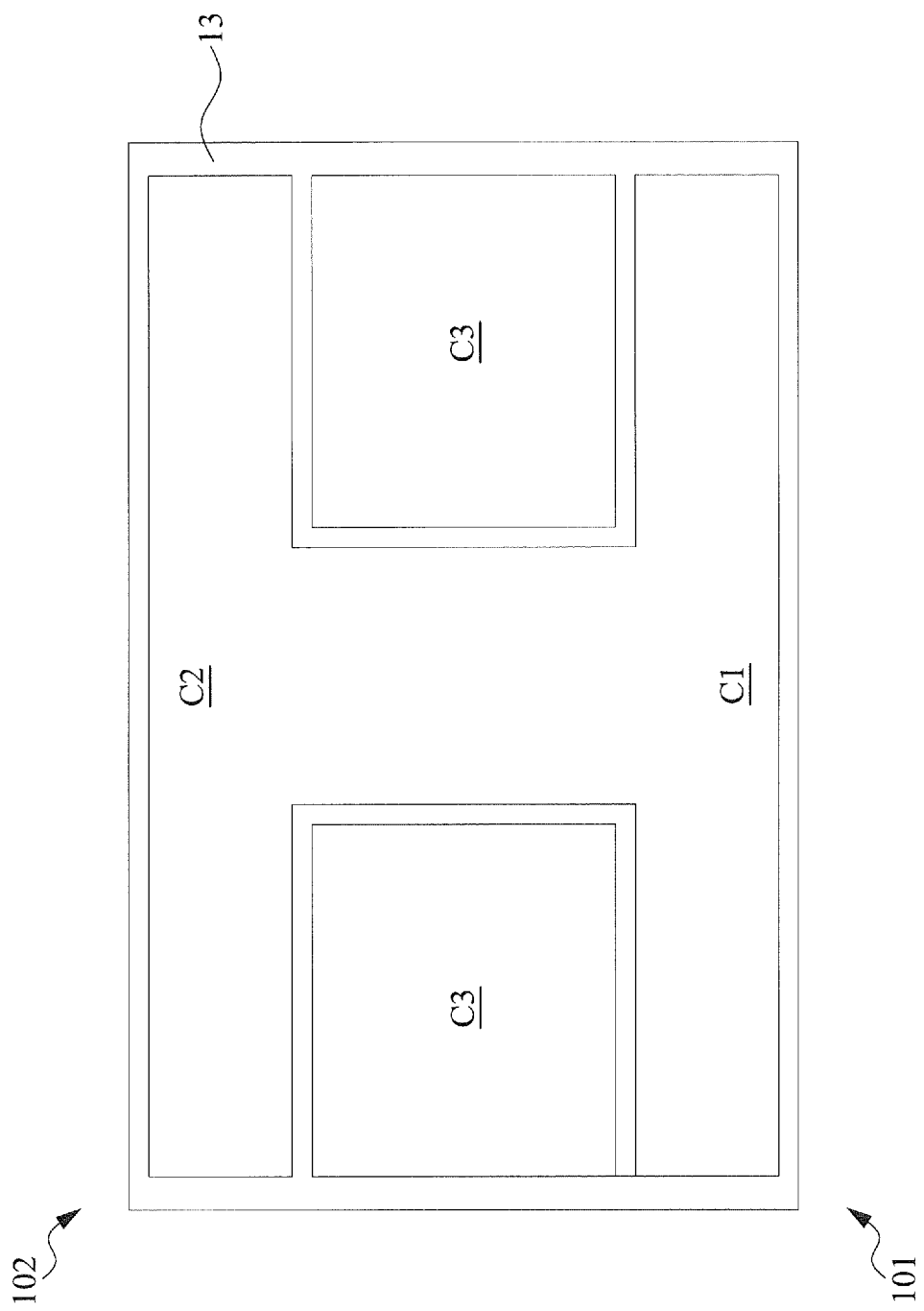
FIG. 7E is a cross-section of a part of a display case, in accordance with an embodiment of the present disclosure.

Referring to FIG. 7E, the heat exchanger 13 in FIG. 7E is similar to the heat exchanger 13 in FIG. 7D, with differences in that the channel C1 and the channel C2 are collectively formed as one piece. For example, the channel C1 and the channel C2 may be a combination of channels on sides 101 and 102.

Figure 7F:
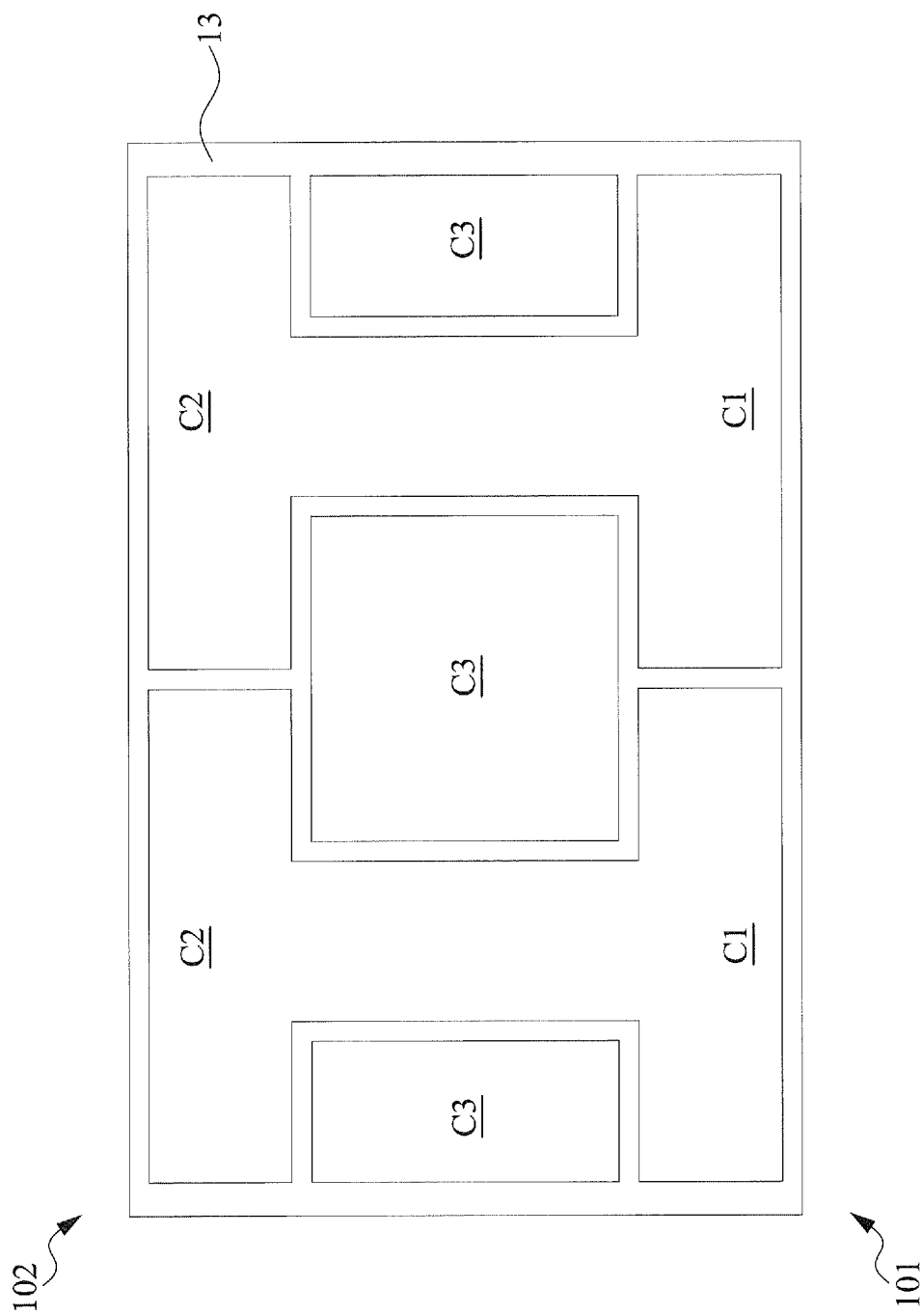
FIG. 7F is a cross-section of a part of a display case, in accordance with an embodiment of the present disclosure.

Referring to FIG. 7F, the heat exchanger 13 in FIG. 7F is similar to the heat exchanger 13 in FIG. 7E, with differences in that the heat exchanger 13 in FIG. 7F includes two combinations of channels on sides 101 and 102. In addition, the heat exchanger 13 in FIG. 7F includes three channels C3 for circulating external airflows.

Figure 7G:
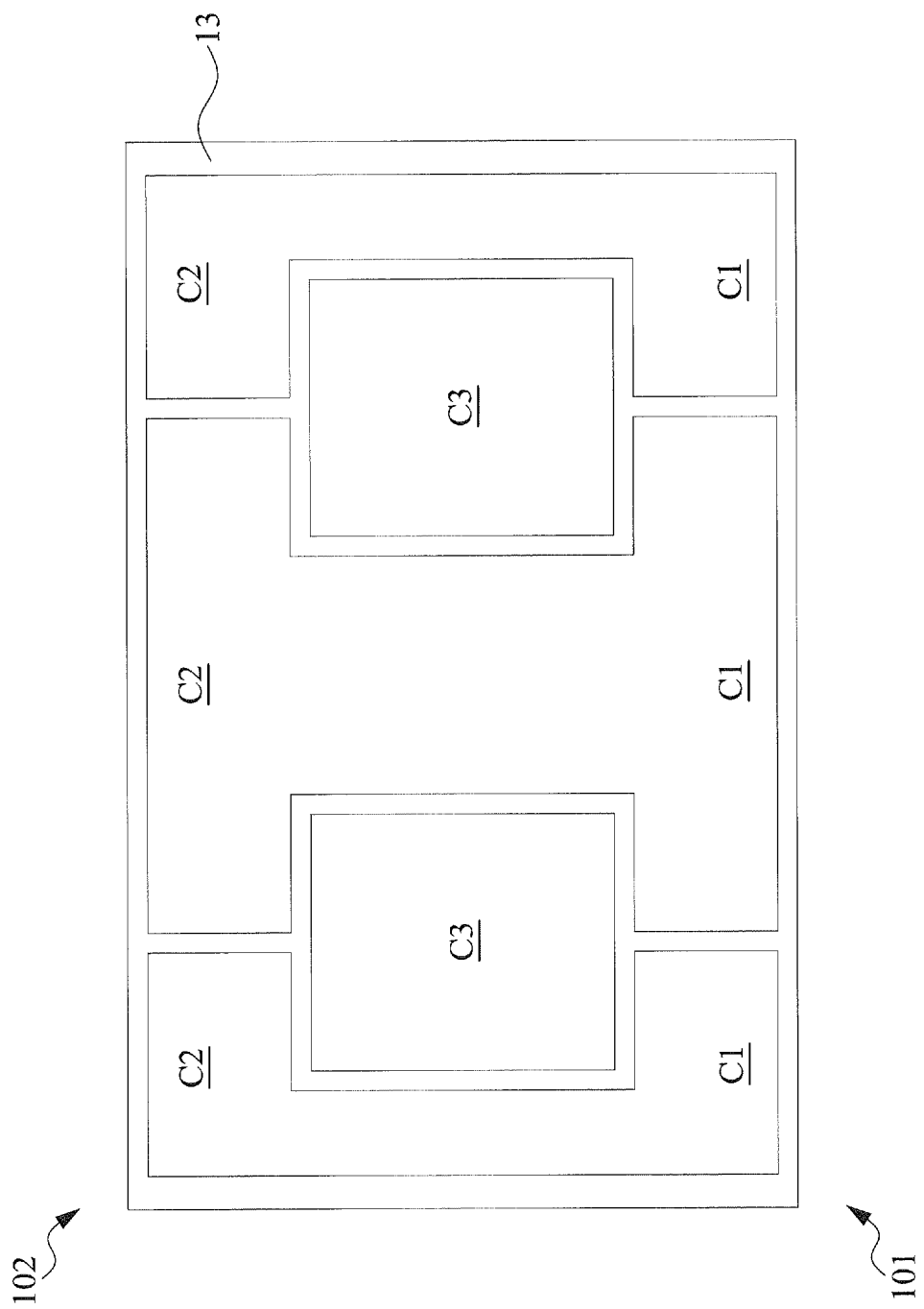
FIG. 7G is a cross-section of a part of a display case, in accordance with an embodiment of the present disclosure.

Referring to FIG. 7G, the heat exchanger 13 in FIG. 7G is similar to the heat exchanger 13 in FIG. 7F, with differences in that the heat exchanger 13 in FIG. 7G includes three combinations of channels on sides 101 and 102. In addition, the heat exchanger 13 in FIG. 7G includes two channels C3 for circulating external airflows. Each of the channels C3 is surrounded by the combinations of channels on sides 101 and 102.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A display case, comprising:
   a central portion having an inlet and an outlet opposite to the inlet;
   a first transparent lid disposed on a first side of the central portion and configured to define a first space on the first side of the central portion;
   a second transparent lid disposed on a second side of the central portion and configured to define a second space on the second side of the central portion; and
   a heat exchanger in the central portion and comprising a first channel and a second channel,
   wherein the first channel of the heat exchanger is fluidly conducted to the first space and defines a part of a first internal heat exchange loop, and the second channel of the heat exchanger is fluidly conducted to the second space and defines a part of a second internal heat exchange loop.

2. The display case of claim 1, wherein the first space is fluidly conducted to the second space.

3. The display case of claim 2, wherein the first internal heat exchange loop is fluidly conducted to the second internal heat exchange loop on at least one side of the display case.

4. The display case of claim 1, further comprising a first internal flow generator disposed adjacent to the first channel and a second internal flow generator disposed adjacent to the second channel.

5. The display case of claim 4, wherein the first internal flow generator is configured to exhaust air from the first channel into the first space, and the second internal flow generator is configured to exhaust air from the second channel into the second space.

6. The display case of claim 1, wherein the heat exchanger further comprises a third channel and a fourth channel, wherein the third channel and the fourth channel define an external heat dissipation path connected between the inlet and the outlet of the central portion.

7. The display case of claim 6, wherein the first channel, the third channel, the fourth channel, and the second channel are sequentially stacked on top of each other.

8. The display case of claim 6, wherein the first internal heat exchange loop and the second internal heat exchange loop are isolated from the external heat dissipation path by a baffle.

9. The display case of claim 6, further comprising an external flow generator fluidly conducting to the external heat dissipation path.

10. The display case of claim 1, wherein the first transparent lid is rotatably connected to the display case through a first pivot joint and the second transparent lid is rotatably connected to the display case through a second pivot joint.

11. The display case of claim 10, wherein the first transparent lid has a first location and a second location with respect to the central portion, wherein the first transparent lid at the first location and a first sealing component seals the first internal heat exchange loop in the display case and isolates the first internal heat exchange loop from outside of the display case, and wherein the first transparent lid at the second location exposes the first internal heat exchange loop to outside of the display case.

12. The display case of claim 1, further comprising a first carrier for carrying a first display module in the first space and a second carrier for carrying a second first display module in the second space.

13. The display case of claim 12, wherein the first carrier and the second carrier directly contact the heat exchanger.

14. A display case, comprising:
   a central portion having an inlet and an outlet opposite to the inlet;
   a first transparent lid disposed on a first side of the central portion and defines a first space on the first side of the central portion;
   a second transparent lid disposed on a second side of the central portion and defines a second space on the second side of the central portion; and
   a heat exchanger in the central portion and comprising a first channel fluidly conducted to the first space, a second channel fluidly conducted to the second space, a third channel, and a fourth channel,
   wherein the third channel and the fourth channel define an external heat dissipation path connected between the inlet and the outlet of the central portion, and the external heat dissipation path is isolated from the first space and the second space.

15. The display case of claim 14, wherein the first space is fluidly conducted to the second space.

16. The display case of claim 14, further comprising a first internal flow generator disposed adjacent to the first channel and a second internal flow generator disposed adjacent to the second channel.

17. The display case of claim 16, wherein the first internal flow generator is configured to exhaust air from the first channel into the first space, and the second internal flow generator is configured to exhaust air from the second channel into the second space.

18. The display case of claim 14, wherein the first channel, the third channel, the fourth channel, and the second channel are sequentially stacked on top of each other.

19. The display case of claim 14, further comprising an external flow generator fluidly conducting to the external heat dissipation path.

20. The display case of claim 14, wherein the first transparent lid is rotatably connected to the display case through a first pivot joint and the second transparent lid is rotatably connected to the display case through a second pivot joint.

21. The display case of claim 20, wherein the first transparent lid has a first location and a second location with respect to the central portion, wherein the first transparent lid at the first location and a first sealing component seals a first internal heat exchange loop in the display case and isolates the first internal heat exchange loop from outside of the display case, and wherein the first transparent lid at the second location exposes the first internal heat exchange loop to outside of the display case.

22. The display case of claim 14, further comprising a first carrier for carrying a first display module in the first space and a second carrier for carrying a second first display module in the second space.

23. The display case of claim 22, wherein the first carrier and the second carrier directly contact the heat exchanger.

24. A dual sided display, comprising:
a central portion having an inlet and an outlet opposite to the inlet;
a first display module disposed in a first space on a first side of the central portion;
a second display module disposed in a second space on a second side of the central portion; and
a heat exchanger in the central portion and comprising a first channel fluidly conducted to the first space, a second channel fluidly conducted to the second space, a third channel, and a fourth channel,
wherein the third channel and the fourth channel define an external heat dissipation path connected between the inlet and the outlet of the central portion, and the external heat dissipation path is isolated from the first space and the second space.

25. The dual sided display of claim 24, further comprising a first internal flow generator disposed adjacent to the first channel and a second internal flow generator disposed adjacent to the second channel.

26. The dual sided display of claim 25, wherein the first internal flow generator is configured to exhaust air from the first channel into the first space, and the second internal flow generator is configured to exhaust air from the second channel into the second space.

27. The dual sided display of claim 24, wherein the first channel, the third channel, the fourth channel, and the second channel are sequentially stacked on top of each other.

28. The dual sided display of claim 24, further comprising an external flow generator fluidly conducting to the external heat dissipation path.

29. The dual sided display of claim 24, further comprising a first carrier for carrying the first display module in the first space and a second carrier for carrying the second display module in the second space.

30. The dual sided display of claim 29, wherein the first carrier and the second carrier directly contact the heat exchanger.

* * * * *